(12) United States Patent
Kamiya

(10) Patent No.: US 6,218,882 B1
(45) Date of Patent: *Apr. 17, 2001

(54) DIODE CIRCUIT FOR CLAMPING THE SIGNALS ON A TRANSMISSION LINE TO A PREDETERMINED POTENTIAL

(75) Inventor: Hiroshi Kamiya, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/767,641

(22) Filed: Dec. 17, 1996

(30) Foreign Application Priority Data

Dec. 23, 1995 (JP) .................................... 7-350128

(51) Int. Cl.[7] ...................................... H03K 5/08
(52) U.S. Cl. .......................... 327/314; 327/320; 327/325
(58) Field of Search .................................. 327/314, 320, 327/321, 325, 534, 536; 361/56, 91

(56) References Cited

U.S. PATENT DOCUMENTS

| | | | |
|---|---|---|---|
| 3,736,465 | * 5/1973 | Rowe | 315/239 |
| 3,932,772 | * 1/1976 | Graves et al. | 327/111 |
| 4,167,036 | * 9/1979 | Kenney | 363/61 |
| 4,689,713 | * 8/1987 | Hourtane et al. | 361/118 |
| 4,888,498 | * 12/1989 | Kadakia | 327/576 |
| 5,029,063 | * 7/1991 | Lingstaedt et al. | 327/534 |
| 5,059,815 | * 10/1991 | Bill et al. | 327/536 |
| 5,264,752 | * 11/1993 | Savicki | 310/316 |
| 5,327,017 | * 7/1994 | Fischer | 327/407 |
| 5,489,870 | * 2/1996 | Arakawa | 327/534 |
| 5,545,909 | * 8/1996 | Williams et al. | 361/56 |
| 5,559,687 | * 9/1996 | Nicollini et al. | 363/60 |
| 5,589,697 | * 12/1996 | Smayling et al. | 327/536 |
| 5,635,776 | * 6/1997 | Imi | 307/110 |
| 5,675,622 | * 10/1997 | Hewitt et al. | 377/33 |

FOREIGN PATENT DOCUMENTS 54-125958   9/1979 (JP) .

* cited by examiner

Primary Examiner—Terry D. Cunningham
(74) Attorney, Agent, or Firm—Foley & Lardner

(57) ABSTRACT

A diode circuit of the present invention comprise an input/output terminal connected to the transmission line, a power supply terminal connected to the power supply, a plurality of diodes connected in series between the input/output terminal and the power supply terminal and a capacitive element having one end connected to a connected point of the plurality of diodes and the other end connected to the ground. In the input/output terminal, an applied signal from the transmission line exceeds the predetermined potential, it is clamped to the predetermined potential by the plurality of diodes connected in series. At the connecting points among a plurality of diodes and the input/output terminal, vibration of potential is reduced by the capacitance element.

8 Claims, 9 Drawing Sheets

DIODE CIRCUIT FOR CLAMPING THE SIGNALS ON A TRANSMISSION LINE TO A PREDETERMINED POTENTIAL

BACKGROUND OF THE INVENTION

The present invention relates to a diode circuit and more particularly to a diode circuit for clamping the signals on the transmission line to the predetermined potential.

A diode circuit of this type consisted of one diode and used to reduce an AC noise in a signal on transmission line by clamping to a particular potential. This diode circuit consisted of one diode was provided with transmission line to transmit the 1.5 V signal from the region having the 1.5 V power supply layer to the region having the 3.3 V power supply layer adjacently located on the region having the 1.5 V power supply layer (hereinafter referred to as related art 1).

Moreover, a diode circuit comprising a plurality of diodes is described in the Japanese Patent Application Laid-Open No. Sho 125958/1979. This diode circuit comprising a plurality of diodes connected in series between the collector of transistor connected to a gate transistor and the ground in order to reduce and fix an output level of the TTL circuit (hereinafter referred to as related art 2).

However, the related art 1 has a problem that when it is required to supply the 1.5 V signal to the area isolated far from the region having the 1.5 V power supply layer among the region having the 3.3 V power supply layer, the effect of clamping is lost and the signal on the transmission line vibrates, because the transmission line becomes long and thereby an inductance element of this transmission line becomes large. Moreover, when the signal on the transmission line has a frequency element as high as 1 GHz, here rises also a problem that the diode circuit of the related art 1 comprising only one diode cannot eliminate such high frequency element. Moreover, the related art 1 also has a problem that clamping at the predetermined potential is impossible because the clamping voltage cannot be set to the voltage lower than 3.3 V even if the signal is clamped with only one diode by using the adjacent 3.3 V power supply layer.

Moreover, the related art 2 is composed of a plurality of diodes only to fix the DC potential in the device and is not intended to eliminate the AC noise element at all. This AC noise element impedes the correct operation in such circuit using a small amplitude signal at a high speed as a GTL (Gunning Transceiver Logic).

It is therefore an object of the present invention to provide a diode circuit which can eliminate high frequency AC noise included in the voltage waveform on the transmission line. Moreover, it is also an object of the present invention to provide a diode circuit which can obtain the desired potential and more particularly to provide a diode circuit capable of obtaining the 1.5 V signal from the region having the 3.3 V power supply layer in the region having the same 3.3 V power supply layer.

SUMMARY OF THE INVENTION

A diode circuit of the present invention comprises an input/output terminal connected to a transmission line, a power supply terminal connected to the power supply, a plurality of diodes connected in series between said input/output terminal and said power supply terminal and a capacitive element having one end thereof connected to the connecting point between adjacent two said diodes connected in series and the other end thereof connected to the ground.

The other diode circuit of the present invention comprises a first terminal connected to a first power supply, a second terminal connected to a second power supply, a plurality of diodes connected in series between said first and second terminals, an input/output terminal provided at least one connecting point among those of said plurality of diodes connected in series and a capacitance element having one end thereof connected to the connecting point between adjacent two said diodes connected in series and the other end thereof connected to the ground.

BRIEF DESCRIPTION OF THE DRAWINGS

Other features and advantages of the invention will be made more apparent by the detailed description hereunder taken in conjunction with the accompanying drawings, wherein.

DETAILED DESCRIPTION OF THE PREFERRED EMBODIMENTS

The present invention will be explained in detail with reference to the accompanying drawings.

Figure 1:
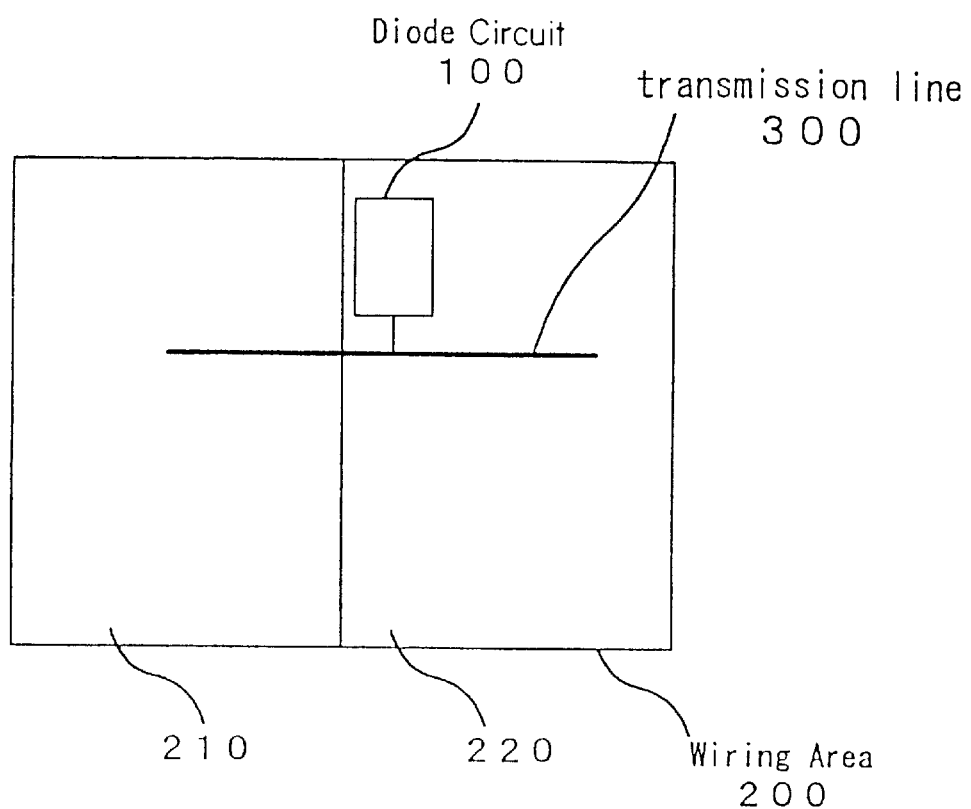
FIG. 1 is a diagram showing a wiring region where a diode circuit of the present invention is used.

Referring to FIG. 1, the diode circuit 100 of the present invention is connected to a transmission line 300 provided between a wiring region 210 having the 1.5 V power supply layer and the wiring region 220 having the 3.3 V power supply layer. A wiring region 210 having the 1.5 V power supply layer and the wiring region 220 having the 3.3 V power supply layer are provided adjacently in the wiring area 200. The wiring region 220 only have the 3.3 V power supply layer. The diode circuit 100 is provided within the wiring region 220 having the 3.3 V power supply layer and connected to the transmission line 300 to remove the high frequency AC noise included in the 1.5 V signal transmitted from the wiring region 210 by clamping that AC noise to 1.5 V.

Next, a first embodiment of the diode circuit 100 of the present invention will be explained in detail with reference to the accompanying drawings.

Figure 2:
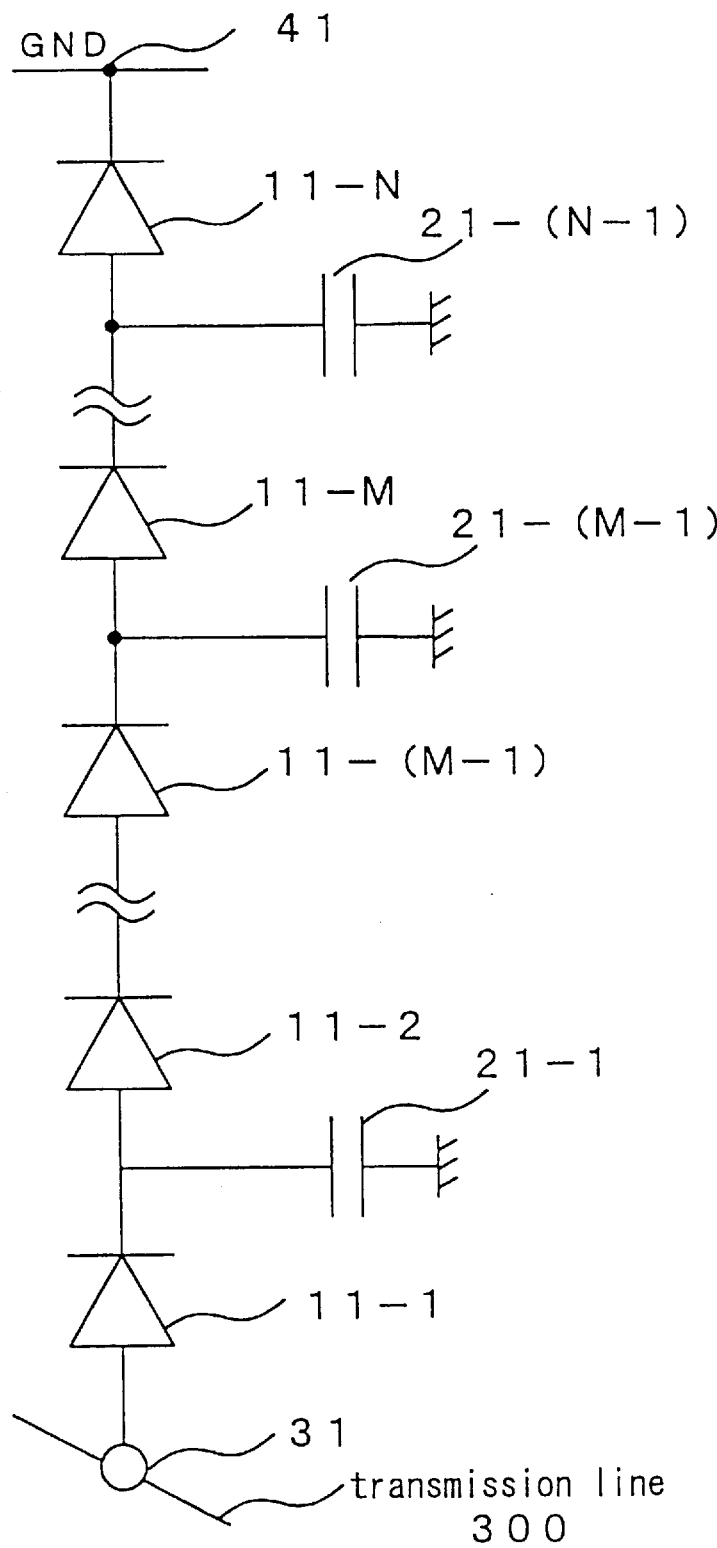
FIG. 2 is a circuit diagram of a first embodiment of the present invention.

Referring to FIG. 2, in the first embodiment of the present invention, the diode circuit comprises a plurality of diodes 11-1, . . . and 11-N (hereinafter, N is an integer of N>0) connected between the input/output terminal 31 and the terminal 41 connected to the power supply. Connecting points among a plurality of diodes 11-1, . . . 11-N are provided with a plurality of capacitors 21-1, ... and 21-(N-1) to prevent vibration of potential respectively. In this embodiment, the terminal 41 is connected to the ground GND. A plurality of diodes are composed of the first diode 11-1, second diode 11-2, ..., (M-1)th diode 11-(M-1) (hereinafter, M is an integer of 0<M <N), Mth diode 11-M, ... and Nth diode 11-N which are connected in series. The input/output terminal 31 is connected to the anode of the first diode 11-1. The cathode of the first diode 11-1 is connected to one end of a capacitor 21-1 and the anode of the second diode 11-2. The other end of a capacitor 21-1 is connected to the ground. The cathode of the (M-1)th diode 11-(M-1) is connected to one end of a capacitor 21-(M-1) and the anode of the Mth diode 11-M. The cathode of the Nth diode 11-N is connected to a terminal 41 connected to the ground GND.

Forward voltages of a plurality of diodes 11-1, 11-2, ..., 11-(M-1), 11-M, ... and 11-N are VF1, VF2, ..., VF(M-1), VFM, ..., and VFN volts respectively. In this case, the clamping voltage at the anode of the Nth diode 11-N is VFN volt. The clamping voltage at the anode of the Mth diode 11-M becomes (VFN+ ... +VFM) volt. The clamping voltage at the anode of the first diode 11-1 becomes {VFN+ ... +VFM(M-1)+ ... +VF2+VF1} volt. Therefore, the values of VFN, ..., and VF1 are set so that the value of {VFN+ ... +VFM(M-1)+ ... +VF2+VF1} becomes equal to the potential for the clamping. In this embodiment, a schottky diode is used. Since the forward voltage of the schottky diode is about 0.4 volt, {VFN+ ... +VFM(M-1)+ ... +VF2+VF1} is set to about 1.6 volt.

Next, operations of this embodiment will be explained. Referring to FIG. 1 and FIG. 2, the 1.5 volt signal is supplied to the wiring region 220 having the 3.3 volt power supply layer from the wiring region 210 having the 1.5 volt power supply layer through the transmission line 300. When this signal enters the wiring region 220 having the 3.3 volt power supply layer, it has a high frequency waveform element. When the potential of the signal inputted from the input/output terminal 31 exceeds the voltage about {VFN+ ... +VFM(M-1)+ ... +VF2+VF1} volt, namely, 1.6 volt, it is clamped to the potential of about 1.6 volt and high frequency noise can also be eliminated.

As explained above, according to this embodiment, the predetermined potential can be obtained using the ground GND, since a plurality of diodes connected in series are provided between the input/output terminal 31 connected to the transmission line and the ground GND. Moreover, since a capacitor having one end connected to each connecting point of a plurality of diodes and the other end connected to the ground GND is provided, vibration of potential in the each connecting point of the plurality of diodes and the power supply terminal 41 due to a longer distance between the power supply terminal 41 and input/output terminal 31 can be reduced.

Next, a second embodiment of the present invention is explained in detail with reference to FIG. 3. In the second embodiment, the second input/output terminal 32-2, ... and Nth input/output terminal 32-N are provided to the connecting points of a plurality of diodes 11-1, 11-2, ... 11-N connected in series in the first embodiment respectively. The other structural elements are the same as those of the first embodiment.

Figure 3:
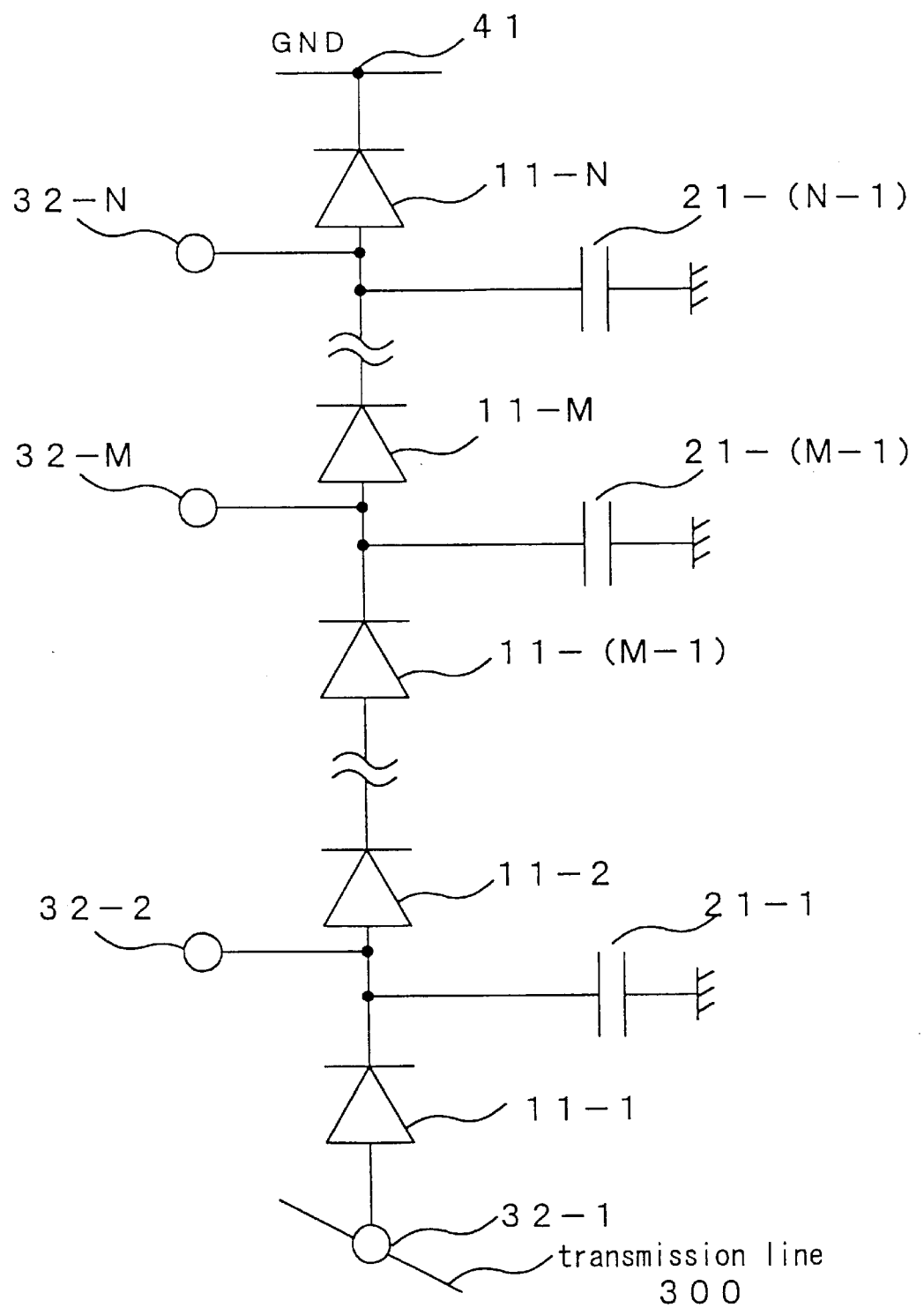
FIG. 3 is a circuit diagram of a second embodiment of the present invention.

In FIG. 3, the first input/output terminal 32-1 is connected to the anode of the first diode 11-1. The second input/output terminal 32-2 is connected between the cathode of the first diode 11-1 and the anode of the second diode 11-2. The Mth input/output terminal 32-M is connected between the cathode of the (M-1)th diode 11-(M-1) and the anode of the Mth diode 11-M. The Nth input/output terminal 32-N is connected between the cathode of the (N-1)th diode 11-(N-1) and the anode of the Mth diode 11-M.

Next, operations of this embodiment will be explained. Since the clamping voltage in the anode of the Nth diode 11-N is VFN volt, when the potential of signal inputted to the Nth input/output terminal 32-N exceeds the VFN volt, it is clamped to VFN volt. When the potential of the signal applied to the first input/output terminal exceeds (VFN+ ... +VFM+ ... +VF1) volt, it is clamped to (VFN+ ... +VFM+ ... VF1) volt since the clamping potential at the anode of the first diode 11-1 is (VFN+ ... +VFM+ ... +VF1) volt. As explained above, according to this embodiment, the a plurality of desired clamping voltages can be set and obtained because the input/output terminals 32-2, ... and 32-N are provided between a plurality of diodes connected in series.

Next, the third embodiment of the present invention will be explained in detail by referring to FIG. 4. In the third embodiment, a plurality of diodes are inversely connected in series to the connection of the first embodiment. The other structural elements are the same as those of the first embodiment.

Figure 4:
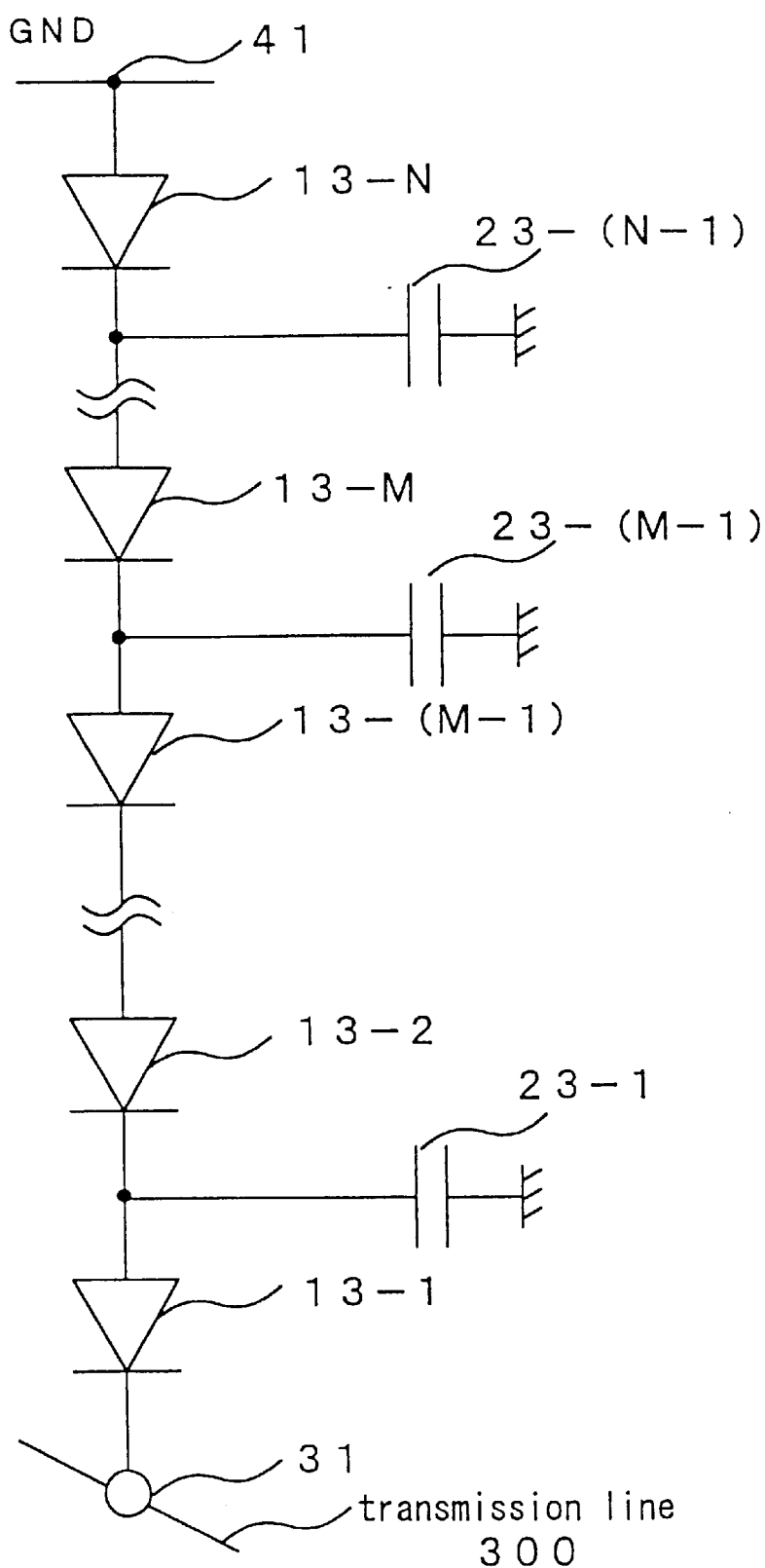
FIG. 4 is a circuit diagram of a third embodiment of the present invention.

In FIG. 4, the input/output terminal 31 is connected to the cathode of the first diode 13-1. The anode of the first diode 13-1 is connected to one end of the capacitor 23-1 and the cathode of the second diode 13-2. The anode of the (M-1)th diode 13-(M-1) is connected to one end of the capacitor 21-(M-1) and the cathode of the Mth diode 13-M. The anode of the Nth diode 13-N is connected to the terminal 41 connected to the ground GND.

The clamping voltage at the cathode of the Nth diode 13-N is -VFN volt. The clamping voltage at the cathode of the Mth diode 13-M is -(VFN+ ... +VFM) volt. The clamping voltage at the cathode of the first diode 13-1 is -(VFN+ ... +VF2+VF1) volt.

Thereafter, operations of this embodiment will be explained. Referring to FIG. 4, when the potential of signal inputted from the input/output terminal 31 becomes lower than -(VFN+ ... +VF2+VF1) volt, it is then clamped to -(VFN+ ... +VF2+VF1) volt. As explained above, according to this embodiment, the desired clamping voltage can be set using the ground GND even in such a circuit using a negative level potential as ECL (Emitter Coupled Logic).

Next, the fourth embodiment of the present invention will be explained in detail with reference to FIG. 5. In the fourth embodiment, the second input/output terminal 34-2, ... and Nth input/output terminal 34-N are provided between a plurality of diodes 13-1, 13-2, ... 13-N coupled in series in the third embodiment respectively. The other structural elements are the same as those of the third embodiment.

Figure 5:
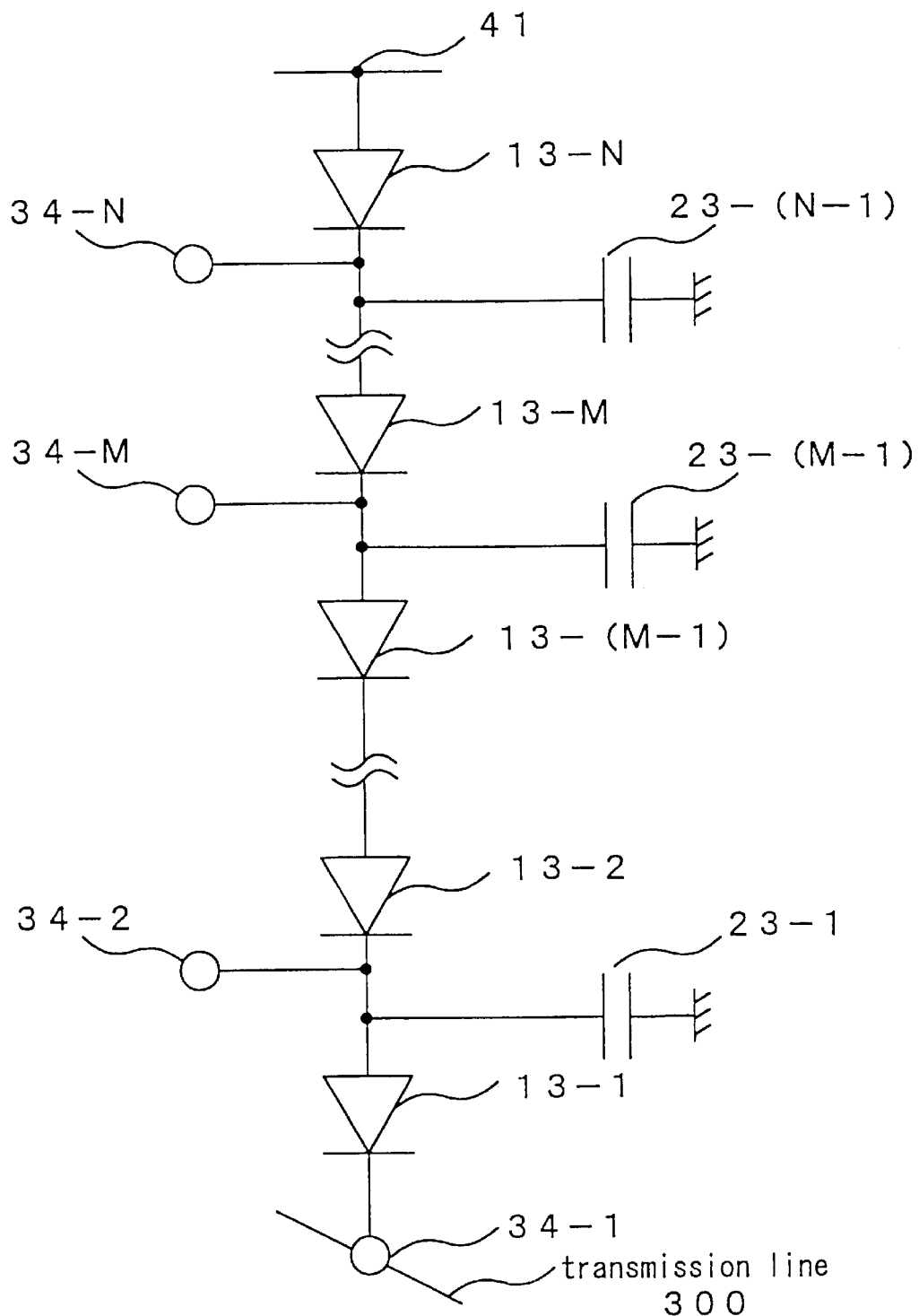
FIG. 5 is a circuit diagram of a fourth embodiment of the present invention.

In FIG. 5, the first input/output terminal 34-1 is connected to the cathode of the first diode 13-1. The second input/output terminal 34-2 is connected between the anode of the first diode 13-1 and the cathode of the second diode 13-2. The Mth input/output terminal 34-M is connected between the anode of the (M-1)th diode 13-(M-1) and the cathode of the Mth diode 13-M. The anode of the Nth diode 13-N is connected to the terminal 41 connected to the power supply. The cathode of the diode 13-N is connected to the input/output terminal 34-N.

Next, operations of this embodiment will be explained. When the potential of signal inputted to the Nth input/output terminal 34-N is higher than -VFN volt, it is clamped to −VFN volt, since the clamping potential at the cathode of the Nth diode 13-N is −VFN volt. When the potential of signal inputted to the first input/output terminal 13-1 is higher than −(VFN+ . . . +VFM+ . . . +VF1), it is clamped to −(VFN+ . . . +VFM+ . . . +VF1) volt, since the clamping potential at the cathode of the first diode 13-1 is −(VFN+ . . . +VFM+VF1). As explained above, according to this embodiment, a plurality of desired clamping potentials can be set even in such a circuit using a negative level potential as ECL.

Figure 6:
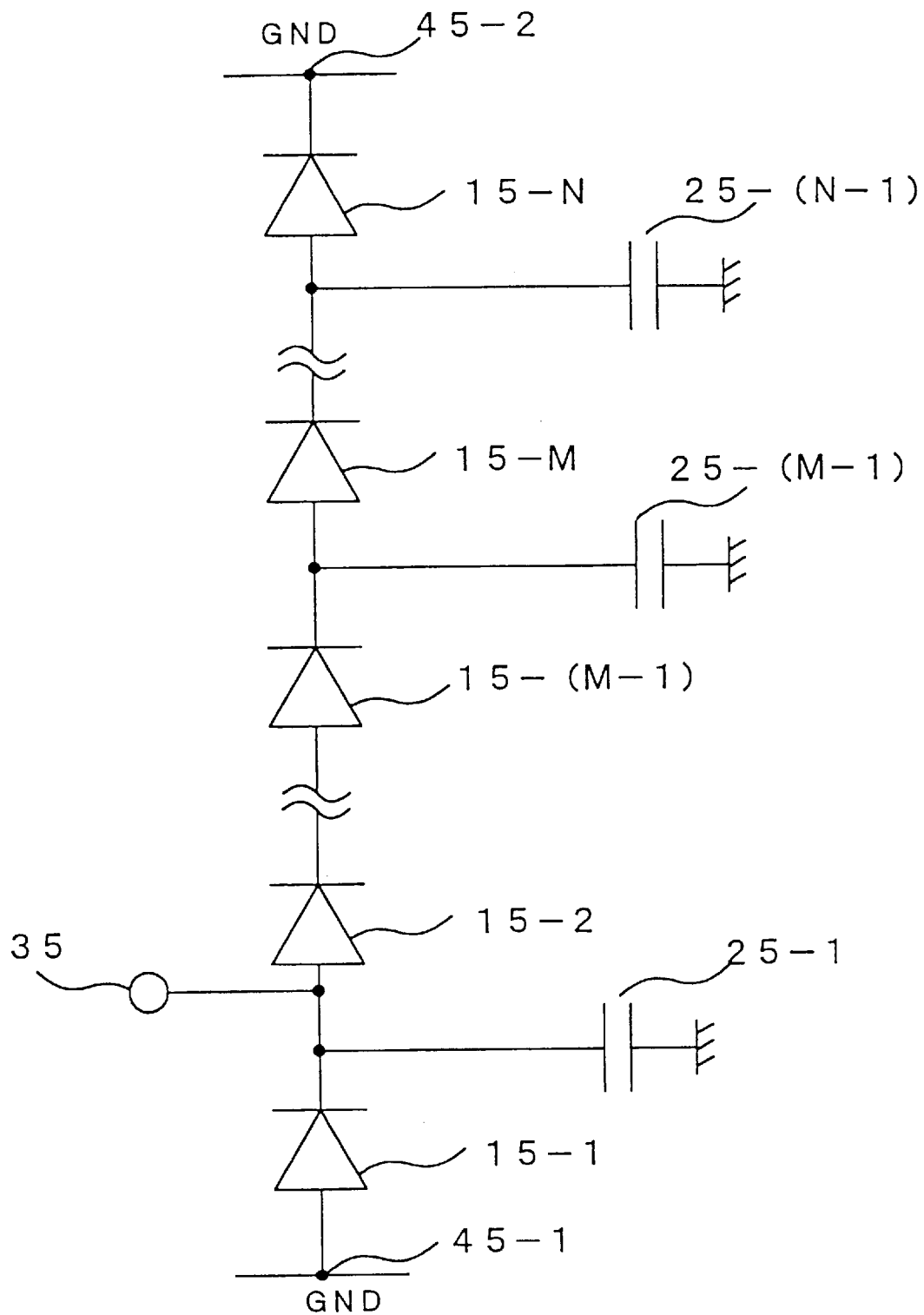
FIG. 6 is a circuit diagram of a fifth embodiment of the present invention.

Next, the fifth embodiment of the present invention will be explained in detail with reference to FIG. 6. In this fifth embodiment, a first terminal 45-1 connected to the first power supply, a second terminal 45-2 connected to the second power supply, a plurality of diodes 15-1, . . . and 15-N connected in series between the first terminal 45-1 and the second terminal 45-2 power and an input/output terminal 35 provided at least one connected point between a plurality of diodes. In this embodiment, both first and second power supplies are connected to the ground GND. A plurality of diodes are composed of the first diode 15-1, second diode 15-2, . . . , (M−1)th diode 15-(M−1) and Mth diode 15-M, . . . , and Nth diode 15-N. The first power supply 45-1 is connected to the anode of the first diode 15-1. The cathode of the first diode 15-1 is connected to one end of the capacitor 25-1 and the anode of the second diode 15-2. An input/output terminal 35 is connected to the anode of the second diode 15-2. The cathode of the (M−1)th diode 15-(M−1) is connected with one end of the capacitor 25-(M−1) and the anode of the Mth diode 15-M. The cathode of the Nth diode 15-N is connected to the terminal 45-2 connected to the ground GND.

The forward voltages of a plurality of diodes 15-1, 15-2, . . . , 15-(M−1), 15-M, . . . , and 15-N are VF1, VF2, . . . , VF(M−1), VFM, . . . , and VFN volts respectively. In this case, the clamping voltage at the anode of the Nth diode 15-N is more than VFN volt or no more than −{VF(N−1)+ . . . +VF2+VF1} volt. The clamping voltage at the anode of the Mth diode 15-M is more than (VFN+ . . . +VFM) volt or no more than −{VF(M−1)+ . . . +VF2+VF1} volt. The clamping voltage at the anode of the second diode 15-2 is more than (VFN+ . . . +VF2) volt or no more than −VF1 volt.

Therefore, when the potential of signal inputted from the input/output terminal 35 exceeds (VFN+ . . . +VF2) volt, it is clamped to (VFN+ . . . +VF2) volt. Moreover, the potential of signal inputted from the input/output terminal 35 becomes lower than −VF1 volt, it is clamped to −VF1 volt. As described, according to this embodiment, the desired clamping voltage can be set using the ground GND.

In this embodiment, the input/output terminal 35 is provided between the first diode 15-1 and the second diode 15-2, but it may be provided anywhere among the connected points of a plurality of diodes.

Next, the sixth embodiment of the present invention will be explained in detail with reference to FIG. 7. In the sixth embodiment of the present invention, the first input/output terminal 36-1, . . . and the (N−1)th input/output terminal 36-(N−1) are provided at the connecting points between a plurality of diodes 15-1, 15-2, . . . and 15-N connected in series in the fifth embodiment respectively. The other structural elements are the same as those of the fifth embodiment.

Figure 7:
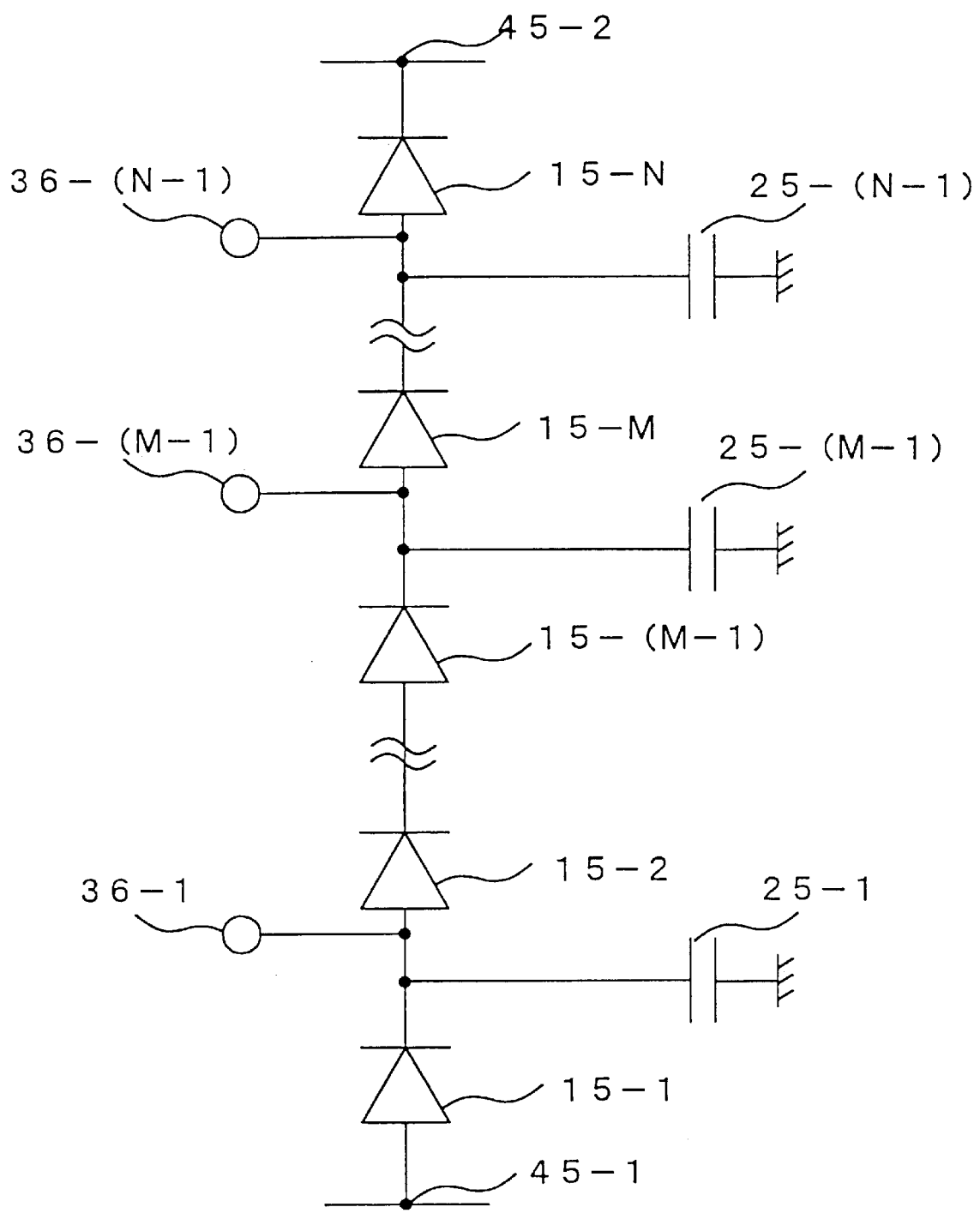
FIG. 7 is a circuit diagram of a sixth embodiment of the present invention.

In FIG. 7, the first input/output terminal 36-1 is connected between the cathode of the first diode 15-1 and the anode of the second diode 15-2. The (M−1)th input/output terminal 36-(M−1) is connected between the cathode of the (M−1)th diode 15-(M−1) and the anode of the Mth diode 15-M. The (N−1)th input/output terminal 34-(N−1) is connected between the cathode of the (N−1)th diode 15-(N−1) and the anode of the Nth diode 15-N.

Next, operations of this embodiment will be explained. The clamping voltage at the anode of the Nth diode 15-N is more than VFN volt or no more than −{VF(N−1)+ . . . +VF2+VF1} volt. Therefore, when the potential of signal inputted to the (N−1)th input/output terminal 34-(N−1) exceeds VFN volt, it is clamped to VFN volt and when such potential becomes lower than −{VF(N−1)+ . . . +VF2+VF1}, it is clamped to −{VF(N−1)+ . . . +VF2+VF1} volt. The clamping voltage at the anode of the second diode 15-2 is more than (VFN+ . . . +VF2) volt or no more than −VFN volt. Therefore, when the potential of signal inputted to the first input/output terminal 34-1 exceeds (VFN+ . . . +VF2) volt, it is clamped to (VFN+ . . . +VF2) and when it becomes lower than −VF1 volt, it is clamped to −VF1 volt. As described, according to the present invention, the desired clamping potentials may be set as required.

Next, the seventh embodiment of the present invention will be explained in detail with reference to FIG. 8.

Figure 8:
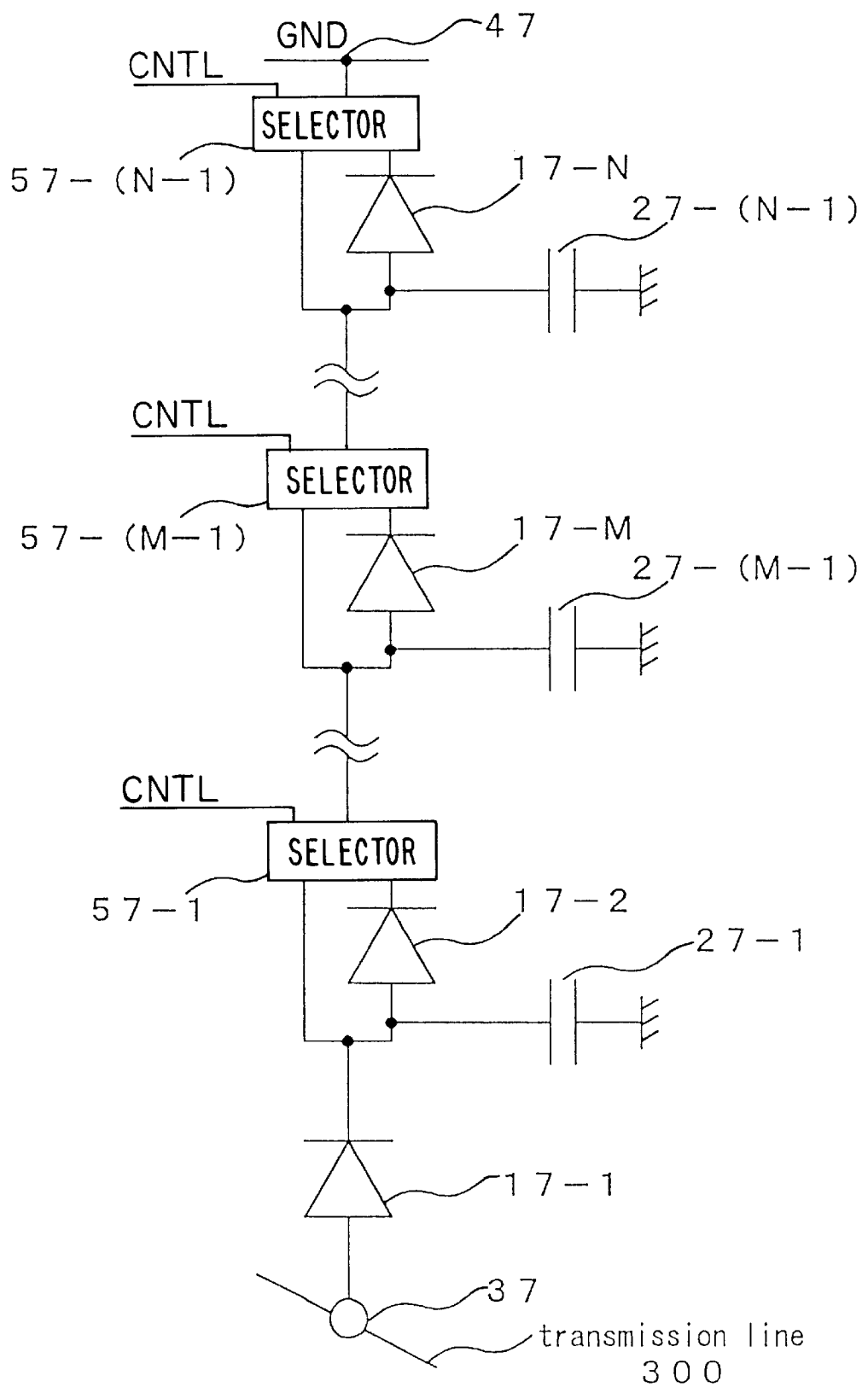
FIG. 8 is a circuit diagram of a seventh embodiment of the present invention.

Referring to FIG. 8, the diode circuit of the seventh embodiment comprises an input/output terminal 37, a power supply terminal 47 connected to the power supply, a plurality of diodes 17-1, . . . and 17-N connected in series between the input/output terminal 37 and power supply terminal 47 and selectors 57-1, . . . and 57-(N−1) for selecting a plurality of diodes. In this embodiment, the power supply terminal 47 is connected to the ground GND. A plurality of diodes comprises the first diode 17-1, second diode 17-2, . . . , (M−1)th diode 17-(M−1), Mth diode 17-M, . . . , and Nth diode 17-N. The input/output terminal 37 is connected to the anode of the first diode 17-1. The cathode of the first diode 17-1 is connected to one end of the capacitor 27-1, anode of the second diode 17-2 and the first selector 57-1. The cathode of the Mth diode 17-M is connected to the (M−1)th selector 57-(M−1). The (M−1)th selector 57-(M−1) is connected to the anode of the diode 17-(M+1) and to the Mth selector 57-M. The cathode of the Nth diode 17-N is connected to the (N'1)th selector 57-(N−1). The (N−1)th selector 57-(N−1) is connected to the terminal 47 connected to the ground GND.

Next, operations of this embodiment will be explained. Referring to FIG. 8, the forward voltages of a plurality of diodes 17-1, 17-2, . . . , 17-(M−1), 17-M, . . . , and 17-N are VF, VF, . . . , $2^{(M-3)}$VF, $2^{(M-2)}$VF, . . . , and $2^{(N-2)}$VF volt respectively. The clamping voltage at the input/output terminal 37 can be set to any value from FV to $2^{(N-2)}$VF volt with a step of VF by controlling the selection signal of the first selector 57-1, . . . and (N−1)th selector 57-(N−1). As described above, according to this embodiment, the desired clamping voltage can be set by controlling the selection signal of selector 57-1, . . . , 57-(N−1).

Figure 9:
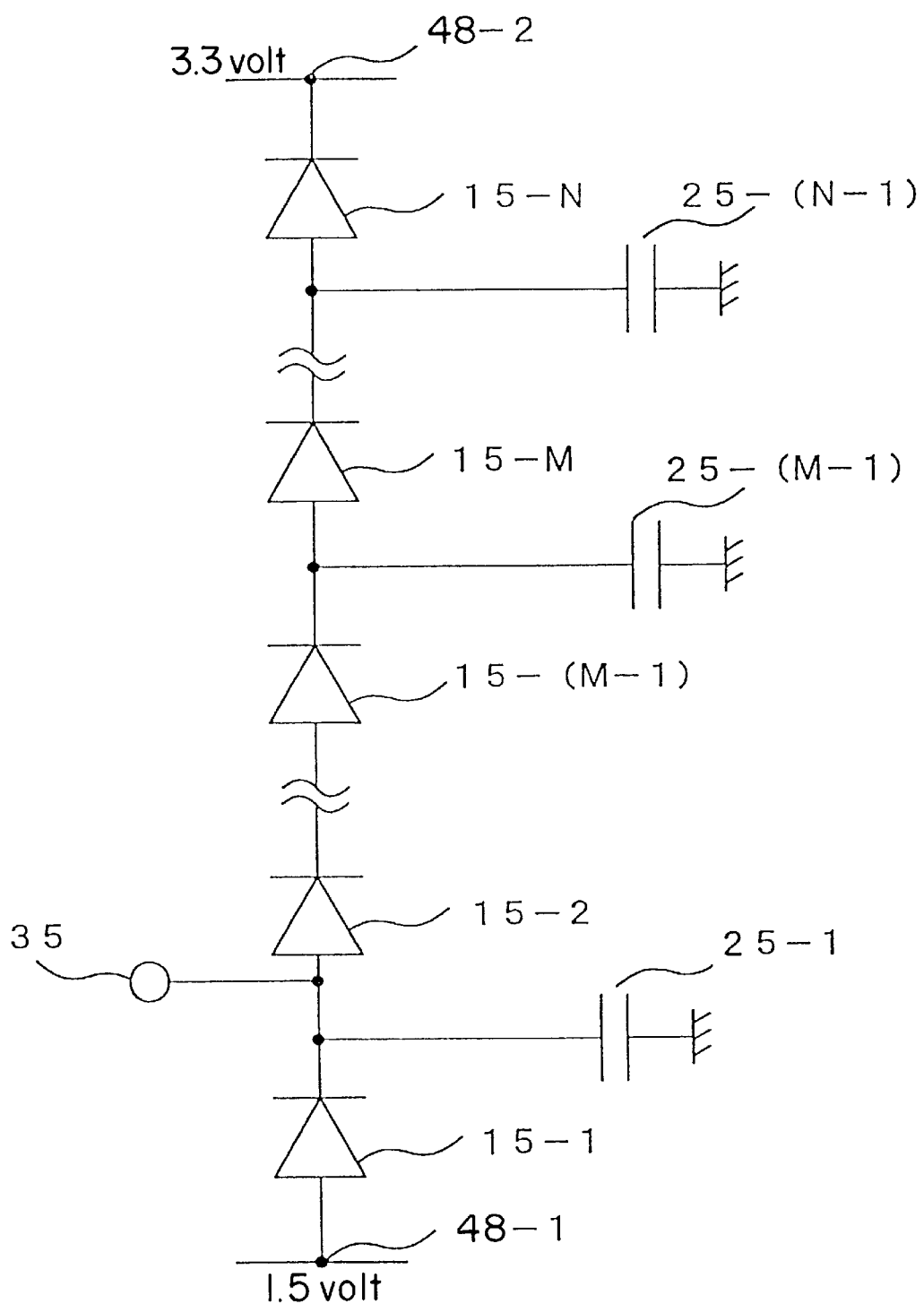
FIG. 9 is a circuit diagram that is similar to the fifth embodiment of the present invention In the drawings, the same reference numerals represent the same structural elements.

In embodiment described above, a schottky diode is used as the diode but the present invention is not limited thereto and a PN junction type diode or MOS (Metal Oxide Semiconductor) type diode may also be used. In addition, the power supply terminal is connected to the ground GND in embodiment described above, but it is not limited thereto and may be connected to the power supply having the potentials of 3.3 volt and 1.5 volt. For example, as shown in FIG. 9, it as possible that a first terminal 48-1 is connected to a power supply having a potential of 1.5 volt, and a second terminal 48-2 is connected to another power supply having a potential of 3.3 volt. The operation of the diode circuit of FIG. 9 is similar to that of the above-described fifth embodiment and its detailed description is omitted.

While this invention has been described in conjunction with the preferred embodiments thereof, it will now readily possible for those skilled in the art to put this invention into practice in various other manners.

What is claimed is:

1. A diode circuit comprising:

an input/output terminal connected to a transmission line;

a ground terminal connected to ground;

a plurality of diodes connected in series between said input/output terminal and said ground terminal, wherein said diodes clamp a potential of said input/output terminal based on forward voltages of said diodes; and first and second capacitive elements, each having one end thereof directly connected to a respective corresponding one of connecting points that lie between respective adjacent ones of said plurality of diodes connected in series, and the other end thereof directly connected to the ground, wherein each of said first and second capacitive element prevents a potential at the respective corresponding connecting point from vibrating.

2. A diode circuit for clamping signals on a transmission line, comprising:

an input/output terminal connected to the transmission line;

a ground terminal connected to ground;

a plurality of diodes connected in series between said input/output terminal and said ground terminal, wherein said diodes clamp a potential of said input/output terminal based on forward voltages of said diodes; and a capacitive element having one end thereof connected to a connecting point between adjacent two of said plurality of diodes connected in series, and the other end thereof connected to ground, wherein said capacitive element prevents a potential at the connecting point from vibrating, and wherein said plurality of diodes connected in series are connected in such a direction as forming a current path to said ground terminal from said input/output terminal.

3. A diode circuit as claimed in claim 1, wherein said plurality of diodes connected in series are connected in such a direction as forming a current path to said input/output terminal from said ground terminal.

4. A diode circuit as claimed in claim 1, further comprising a second input/output terminal connected to at least one connecting point between two adjacent ones of said plurality of diodes.

5. A diode circuit comprising:

a first terminal connected to a transmission line;

a second terminal connected to ground;

a plurality of diodes connected in series between said first terminal and said second terminal;

an input/output terminal connected to a connecting point between two adjacent ones of said plurality of diodes connected in series; and first and second capacitive elements, each having one end thereof directly connected to a respective corresponding one of said connecting point or other connecting points between respective other adjacent ones of said plurality of diodes in series, and the other end thereof directly connected to the ground, wherein each of said first and second capacitive element prevents a potential at the respective corresponding connecting point from vibrating;

wherein said diodes clamp a potential of said input/output terminal based on forward voltages of said diodes.

6. A diode circuit comprising:

an input/output terminal connected to a transmission line;

a ground terminal connected to ground;

a diode which has a first end connected to said input/output terminal and a second end;

a plurality of diodes connected between said second end and said ground terminal;

selecting elements, each of which is connected across a respective one of said diodes in the plurality of diodes in series, and each of said selecting elements is controllable to effectively connect or bypass the corresponding diode into a series path; and a capacitance element having one end thereof connected to a connecting point between two adjacent ones of said plurality of diodes connected in series and the other end thereof connected to the ground, wherein diodes connected in the series path clamp a potential of said input/output terminal based on forward voltages of said diodes connected in the series path.

7. A diode circuit as claimed in claim 6, wherein said plurality of diodes connected in series are connected in such a direction to form a current path to said ground terminal from said input/output terminal.

8. A diode circuit as claimed in claim 6, wherein said plurality of diodes connected in series are connected in such a direction to form a current path to said input/output terminal from said ground terminal.

* * * * *